United States Patent [19]

Shibusawa

[11] Patent Number: 5,099,333
[45] Date of Patent: Mar. 24, 1992

[54] SOLID STATE IMAGE SENSING DEVICE HAVING NO FIELD ISOLATION LAYER

[75] Inventor: Katsuhiko Shibusawa, Tokyo, Japan
[73] Assignee: Oki Electric Industry Co. Ltd., Tokyo, Japan
[21] Appl. No.: 397,753
[22] Filed: Aug. 23, 1989
[30] Foreign Application Priority Data Aug. 24, 1988 [JP] Japan ................... 63-210370

[51] Int. Cl.⁵ ............... H04N 3/14; H04N 5/335; H04N 3/12
[52] U.S. Cl. ................... 358/213.26; 358/212; 358/213.31
[58] Field of Search .......... 358/213.11, 213.26, 358/213.29, 213.31, 212; 357/24 LR

[56] References Cited

U.S. PATENT DOCUMENTS

| | | | |
|---|---|---|---|
| 4,242,700 | 12/1980 | Weimer | 357/24 LR |
| 4,652,925 | 3/1987 | Kimata | 357/24 LR |
| 4,777,519 | 10/1988 | Oshima | 358/213.26 |
| 4,847,692 | 7/1989 | Tabei | 357/24 LR |

OTHER PUBLICATIONS

"A Shallow Flat p-well Structure for Interline-Transfer CCD Image Sensors" by Miyatake et al, *IEEE Trans. Electron Devices*, vol. ED-33, No. 4, Apr. 1986, pp. 458–463.

Primary Examiner—Howard W. Britton
Assistant Examiner—Wendy R. Greening
Attorney, Agent, or Firm—Edward D. Manzo

[57] ABSTRACT

A solid state image sensing device is comprised of a plurality of vertical electrons transfer areas and a plurality of transfer electrodes for receiving different clock signals respectively, a plurality of polysilicon patterns for connecting one of the transfer electrodes in one of the vertical channels to other transfer electrodes receiving the same clock signal in other vertical channels and a plurality of photodiode being alternately disposed to the vertical channels, each of the photodiode being surrounded by a part of each of the polysilicon patterns.

11 Claims, 12 Drawing Sheets

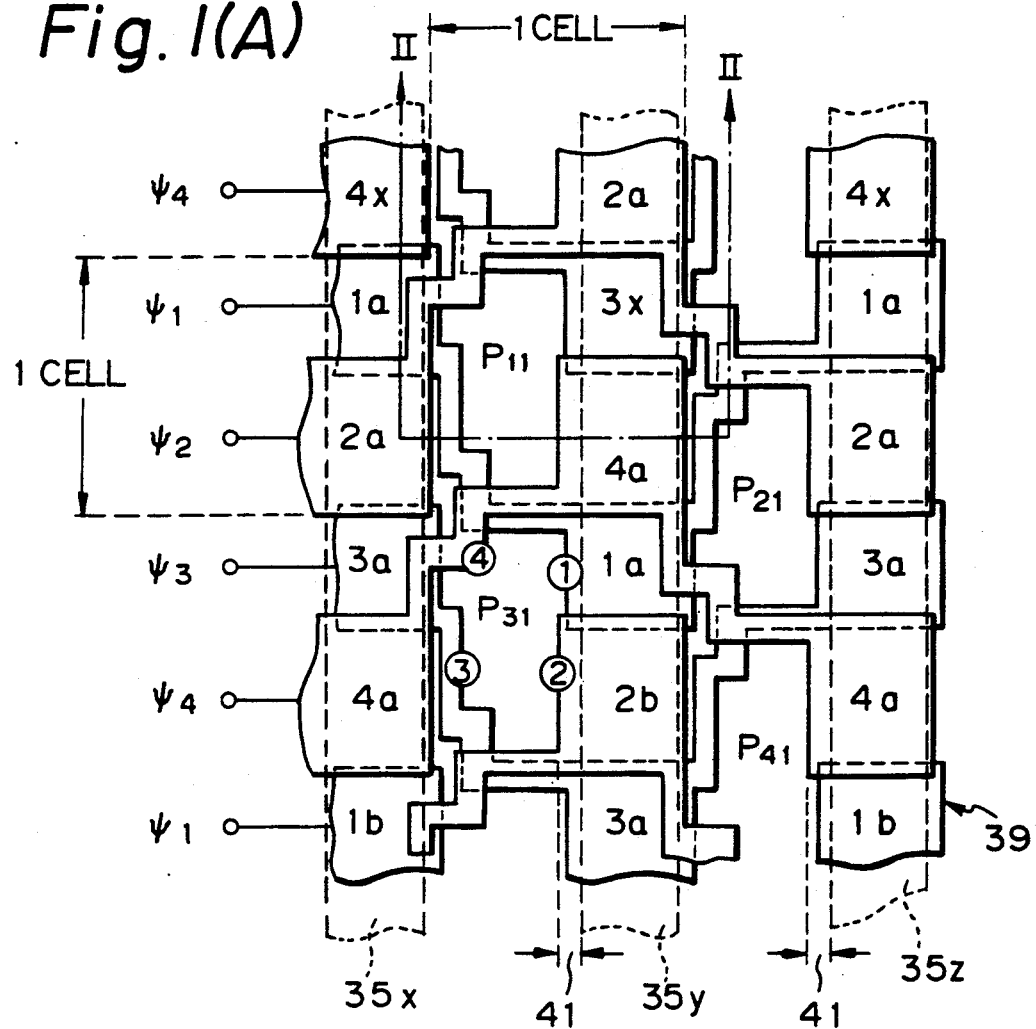
Fig. I(A)
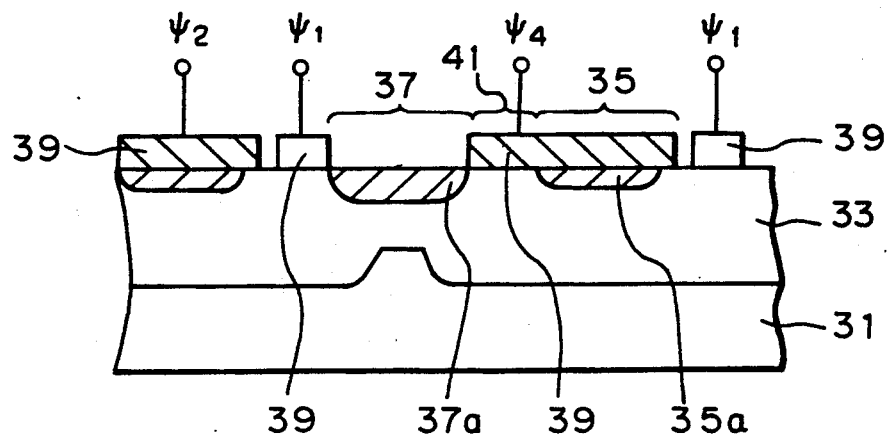
Fig. I(B)

SOLID STATE IMAGE SENSING DEVICE HAVING NO FIELD ISOLATION LAYER

FIELD OF THE INVENTION

This invention relates in general to a solid state image sensing device, and more particularly to a structure of a CCD (Charge Couple Device) area (image) senser.

BACKGROUND OF THE INVENTION

A solid state image sensing device has received much attention as an effective means for inputting an image to a video camera or image processing device.

The solid state image sensing device is classified into a CCD type, MOS type and another by electron transfer forms.

The conventional solid state image sensing device has a plurality of vertical charge transfer channels, an array of photodiodes, a horizontal transfer channel, and a group of electrodes: a first polysilicon electrode for a transfer gate and a second and third electrodes for the vertical transfer channel. The device has a plurality of cells which are formed by these elements, and has thick silicon oxide layers formed by LOCOS for cell isolation.

Electrons stored in the photodiode are transferred to vertical transfer channel when the transfer gate on.

The electrons transferred to the vertical channel are transfered to the horizontal transfer channel and an image processing means sequentially.

In such conventional solid state image sensing device, it is difficult to reduce the cell size because a field oxide layer area is large.

Furthermore, such a device has low reliability because many steps are necessary to manufacture such a structure.

An early improvement was made by using, a solid state image sensing device with two polysilicon layers.

Such a device as shown in FIG. 8 (A) and (B) has a plurality of photodiodes 11, first area 13 of N type serving on as electrons transfer channel, first and second polysilicon layers 15, 17 acting as transfer gates to a horizontal CCD, transfer channel which is formed on a P well area 23 comprised of a silicon substrate of N type. The layer 17 unites the transfer gate.

In this improved device, the second polysilicon layers 17 is combined with transfer gates in a body which emits electrons from photodiode 11 to the first area 13. Three kinds of different voltages are applied to the second polysilicon layer, and two kinds of different voltage are applied to the first polysilicon layer. The highest of the three voltages applied to the second polysilicon layers is used for reading out electrons moving from photodiode 11 to the first area 13. The other voltages are applied to the first and second polysilicon layers are used for transferring electron in the first area 13 to the horizontal CCD. In this case, since one or both of the two kinds of different voltages for transferring electrons to the horizontal CCD are present for negative potential, the adjacent cells located in the vertical direction are not separate field oxide layers but polysilicon layers. Therefore the field oxide areas on the surface of the substrate are decreased.

Since the conventional device as shown in FIG. 8 (A) and (B) has the second polysilicon layer which combine with the transfer gates in a body for reading out electrons from the photodiode, it is necessary to form a field oxide layer between the adjacent cells located in the horizontal direction in order to separate the cells electrically.

Therefore, the field oxide layer between the cells is not removed completely.

It is possible to use a third polysilicon layer instead of the field oxide layer to produce a negative potential for separating the cell electrically. But such a device has a new problem that steps are increased and it is difficult to reduce the cell size.

Accordingly, the general object of this invention is to provide a solid state image sensing device capable of separate cells electrically without using a field oxide layer.

Another object of this invention is to provide a solid state image sensing device having cells which are separated electrically from one another by two polysilicon layers.

SUMMARY OF THE INVENTION

In accordance with the present invention, a solid state image sensing device comprises a plurality of vertical charge transfer channels having a plurality of electron charge transfer channels and a plurality of transfer electrodes for receiving different clock signals respectively, a plurality of polysilicon patterns for connecting one of the transfer electrodes in one of the vertical channels to one of the transfer electrodes in another vertical channel which receives the same clock signal, and a plurality of photodiode arrays being alternately disposed to the vertical channels, each of the photodiode arrays being encircled by a part of each of the polysilicon patterns.

In the present invention, the electrodes are comprised of four kinds of different electrodes, designated as the first, second, third and fourth electrodes. The first through fourth electrodes are arranged in a predetermined fashion formed cyclically and sequentially. Each of the cells in the device is separated without field oxide layers.

Furthermore, in accordance with the present invention, the surface of the substrate is formed more evenly than in the conventional device having the field oxide layers, because the cells are separated by only vertical electrodes.

DESCRIPTION OF THE DRAWING

In the drawings:

FIG. 1 (A) is a plan view of a solid state imaging device in accordance with the first embodiment of the invention.

FIG. 1 (B) is a sectional view taken substantially along line II—II of FIG. (A).

FIG. 2 (B) is the second polysilicon pattern illustrating interconnection relations between the 2nd and 4th electrodes in accordance with the first embodiment of the invention.

FIG. 2 (C) is a detail plan view used to explain the operation of the device.

FIG. 6 (B) is the first polysilicon pattern illustrating interconnection relations between the 2nd and 4th electrodes in accordance with the second embodiment of the invention.

FIG. 6 (C) is a detail plan view in order to explain the operation of the device in accordance with the second embodiment of invention.

FIG. 8 (B) is a sectional view taken substantially along line I—I of FIG. 8 (A).

DESCRIPTION OF PREFERRED EMBODIMENT

Figure 2A:
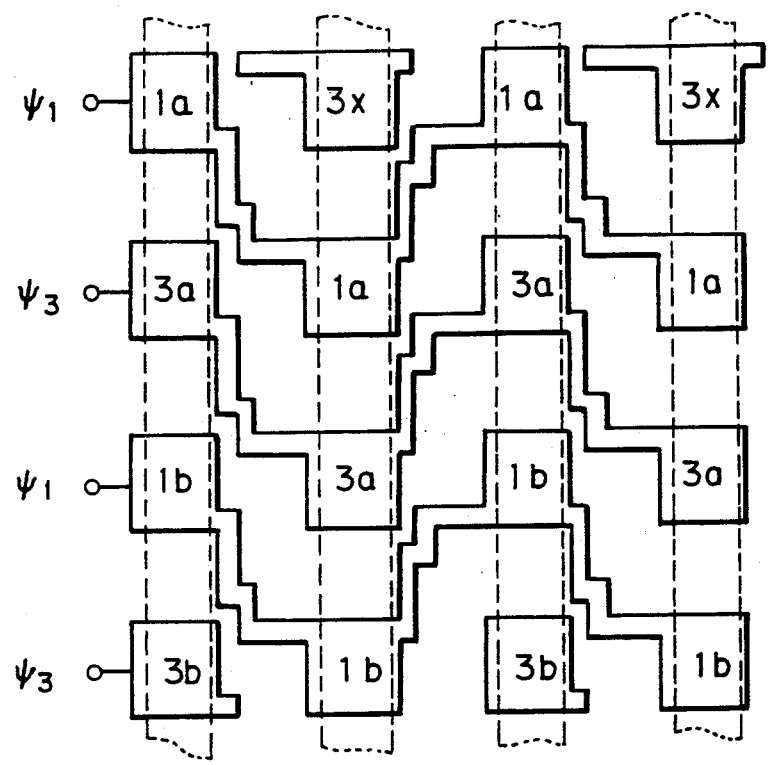
FIG. 2 (A) is the first polysilicon pattern illustrating interconnection relations between the 1st and 3rd electrodes in accordance with the first embodiment of the invention.

A solid state image sensing device of the present invention is explained as follows, referring to the drawings.

The measurements, shapes and arrangements of the preferred embodiment discribed herein are illustrative and not restrictive, the scope of the invention being indicated by the appended claims. All versions which come within the meaning of the claims are intended to be embraced therein.

We turn now to the drawings, wherein like reference characters designate like or corresponding parts throughout the several views.

THE FIRST EMBODIMENT STRUCTURE

FIG. 1 (A) is a plan view of a solid state image sensing device in accordance with the first embodiment of the invention, and FIG. 1 (B) is a sectional view taken substantially along line II—II of FIG. 1 (A).

In FIG. 1 (B), the device has a P type or N type silicon substrate 31 with a P well area 33, an N type area 35a as a transfer road for electrons, and an N type area 37a for the photodiode 37 formed at the surface.

It is possible to form a P type area on the N type area 37a in order to increase a photodiode capacity.

The device further has n kinds of electrodes for the vertical transfer electrodes, to receive differential clock signals respectively.

A transfer gate 41 is formed in a part of the electrode 39.

In the sectional view of FIG. 1B, three distinct electrodes 39 are shown. However, it will be seen from the plan view of FIG. 1A that four electrodes are used for the four clock signals.

A solid state image sensing device will be described with reference to FIG. 1 (A).

The device has three vertical charge transfer channels 35x, 35y, 35z and a photodiode array with elements P11, P31, P21, P41 arranged alternatively as shown in FIG. 1A.

The electrodes for the vertical channels 35x, 35y, 35z comprise first electrodes 1a, 1b to which a clock signal $\psi 1$ is applied, second electrodes 2a, 2b to which a clock signal $\psi 2$ is applied, third electrodes 3a, 3x to which a clock signal $\psi 3$ is applied and fourth electrodes 4a, 4x to which a clock signal 4 is applied.

The first, second third and fourth electrodes 39 which are formed on any single vertical channel 35x, 35y, 35z are arranged cyclically in this order, viz. 1, 2, 3, 4, as seen in FIG. 1A. In the adjacent vertical channel the electrodes are arranged with a cycle offset by two stages so that as one progresses across FIG. 1A horizontally, first electrodes are next to third electrodes, and second electrodes are next to fourth electrodes.

For example, the electrodes of the vertical CCD array 35x are arranged in order of 4x-1a-2a-3a-4a-1b. The electrodes of the vertical CCD array 35y are arranged along a longer direction in order of 2a-3x-4a-1a-2b-3a which also conforms to the cycle of 1, 2, 3, 4. Thus, it will be seen that charge transfer channels 35x, 35y and 35z all are formed by an ordered succession or sequence of first, second third and fourth electrodes when viewed from top to bottom in the figures.

Thus, in the adjacent vertical channels 35x, 35y first electrode 1a of channel 35x is adjacent to and corresponds with the third electrode 3x of the vertical charge transfer channel 35y. Namely, the electrode in the adjacent vertical charge transfer channel 35y. It will be understood that referring to adjacent arrays, first electrodes are adjacent to third electrodes and second electrodes are next to fourth electrodes. In this way, the order of the cycle is shifted each other with two stages.

Figure 2B:
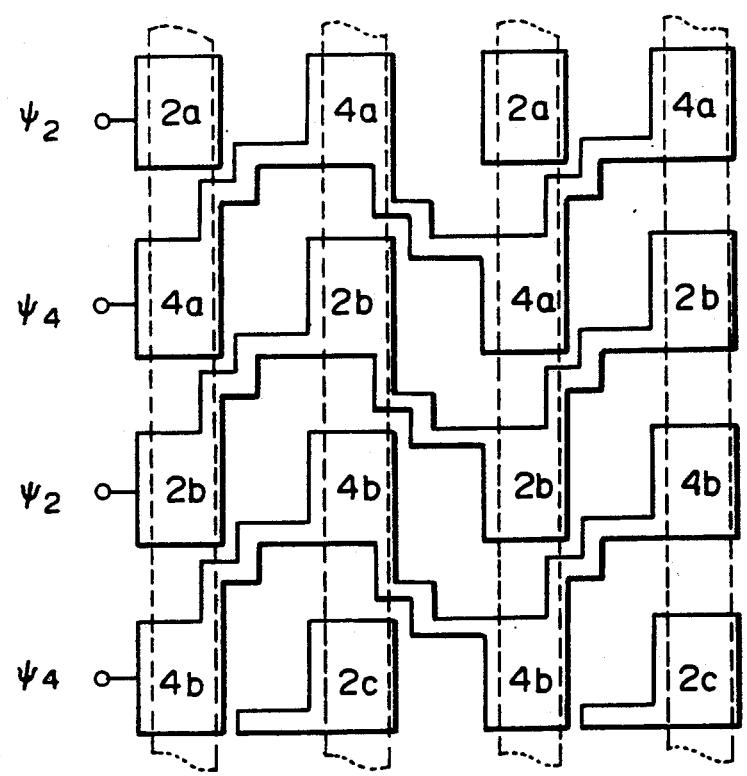

Furthermore, the electrodes of the same kind are disposed in a zigzag pattern. As best seen in FIGS. 2A and 2B, electrodes 1a for example are arranged in a (digitized) sawtooth or zigzag pattern, as are the other electrodes. The electrodes of the same kind on the different vertical channels are connected along the edge of photodiode by polysilicon patterns which are also shown in FIGS. 2A and 2B. The polysilicon patterns from the first electrodes and the third electrodes are geometrically similar, are disposed in a same direction, and may be said to be "in phase". The polysilicon patterns from the second electrode and the fourth electrode are geometrically similar to each other, but are "out of phase" from the pattern shown in FIG. 2A by 180 degrees.

Thus it may be said that polysilicon patterns of the first electrode and the second electrode are disposed in reverse directions.

Looking again at FIG. 1A the polysilicon pattern from the first electrode 1a in the vertical channel 35x extend downward (i.e., toward the bottom of the page) to near the third electrode 3a passing along a right side of the second electrode 2A. The polysilicon pattern reaches the first electrode 1a in the adjacent channel 35y. In this way, the pattern for electrodes 1a detours or skirts around the photodiode P11.

The polysilicon pattern from the first electrode 1a in the vertical channels 35y next extends upward (i.e., toward the top of the page) along the right side of the fourth electrode 4a in the channels and then the polysilicon pattern is connected to the first electrode 1a in the vertical array 35z.

The polysilicon pattern between vertical channel 35y and vertical channel 35z detours around the photodiode P21 similar to the polysilicon pattern between vertical channel 35x and vertical channel 35y.

The polysilicon pattern from the third electrode connects and detours similar to the polysilicon pattern from the first electrode.

The polysilicon pattern from the second electrode 2a in the vertical charge transfer channel 35x extends upward along a right side of the first electrode 1a in the vertical channel 35x, and then generally transverses to the right to join second electrode 2a in the vertical channel 35y.

Then, proceeding to the right the polysilicon pattern extends downward along the right side of the third electrode 3x in vertical channel 35y, and then, generally transverses to the right to join the second electrode 2a in the vertical channel 35z.

The polysilicon pattern associated with electrodes 2a this detours around the photodiodes P11 and P21.

The connection and direction of the polysilicon pattern for the fourth electrodes 4a, 4b are similar to the polysilicon pattern from second electrodes 2a, 2b.

FIG. 2(A) and (B) show the polysilicon pattern interconnections for the electrodes 1a, 3a, 1b, 3b (FIG. 2A) and 2a, 4a, 2b, 4b (FIG. 2B).

Figure 2C:
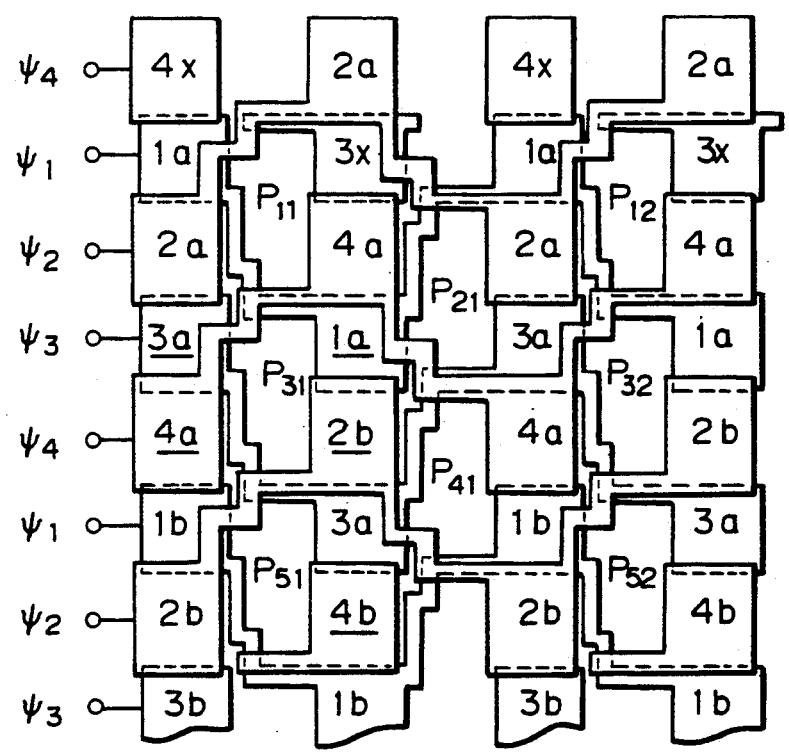

The first electrodes and the third electrodes shown in FIG. 2 (A) are formed on the same surface, and the second electrodes and the fourth electrodes shown in FIG. 2 (B) are formed on the first and third electrodes.

The vertical transfer channels are indicated by broken lines in FIGS. 1A, 2A and 2B.

First, a polysilicon pattern shown in FIG. 2 (A) is formed on the P-well layer 33, and then a polysilicon pattern shown in FIG. 2 (B) is formed in a predetermined relationship.

Vertical electrodes 39 shown in FIGS. 1A and 1B are formed by said step.

Therefore, it will be appreciated from these Figures and the foregoing description that each of the photodiodes is surrounded by parts 1, 2, 3 and 4 of the first, second, third, and fourth electrodes.

It is preferred that the electrodes are formed with polysilicon.

FIRST EMBODIMENT—OPERATION

A read out method and transfer method of electrons in the device of the first embodiment of the invention are explained as follows. Referring to FIG. 2 (C)-FIG. 4 illustrated structure is driven by clock signals of 4 phases.

The second and the fourth electrodes form the second layer and are combined with a transfer gate in a body.

A clock signal $\phi 1$ at the electric potential $V_M$ or $V_L$ is applied to the first electrode to transfer the electrons. A clock signal $\phi 3$ at the electric potential $V_M$ or $V_L$ is applied to the third electrode.

It is preferred that either $V_L$ or $V_M$, or both are set to negative potentials.

A clock signal $\phi 2$ at the electric potential $V_H$ is applied to the second electrode to read out the electrons to the vertical channel from the photodiode, and is at the electric potential $V_M$ or $V_L$ to transfer the electrons. A clock signal $\phi 4$ at the electric potential $V_H$, $V_M$ or $V_L$ is applied to the fourth electrode.

FIG. 3 (A)–(D) and FIG. 4 (A)–(D) are clock diagrams to explain an operation of the device. FIGS. 3(A-D) and 4(A-D) are timing chart diagrams of clock signals which are applied to the electrodes in a field storing mode.

FIG. 3 (A)–(D) is the timing chart diagram of the first field, and FIG. 4 (A)–(D) is the timing chart diagram of the second field.

Since the clock signal $\phi 2$ is at $V_H$ level (12 V, for example) between time t1 and t2, the other clock signal is at $V_L$ level ($-6$ V, for example) in the signal condition, the electrons in photodiode P31 shown in FIG. 2 (C) are applied to the array of electrodes and transfer channels by electrode 2b only, because the electrodes 1a, 3a and 4a (except 2b) which surround the photodiode P31 are at $V_L$ level. The electrons are not transfered to the direction of these electrodes.

The clock signal $\phi 2$ falls from $V_H$ level to $V_L$ level at time t2, and the clock signal $\phi 4$ goes to $V_H$ level at time t3. As a result, the electrons in photodiode P51 shown in FIG. 2 (C) are applied to the array by electrode 4b only. Because the electrodes (except 4b) which surround the photodiode P51 are at $V_M$ or $V_L$ level, the electrons are not transferred in the direction of these electrodes.

Figure 3A:
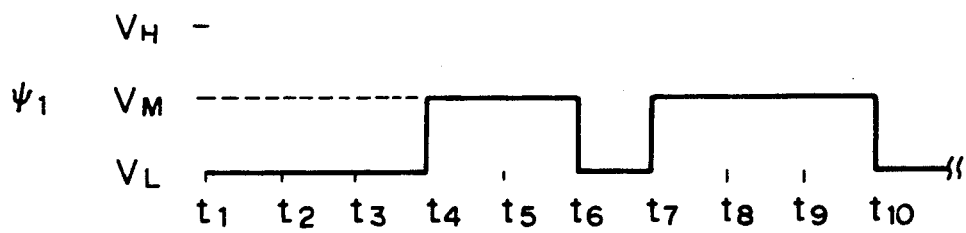
FIG. 3 (A)-(D) is a clock diagram for the first field at NTSC signal operation in the device.
Figure 3B:
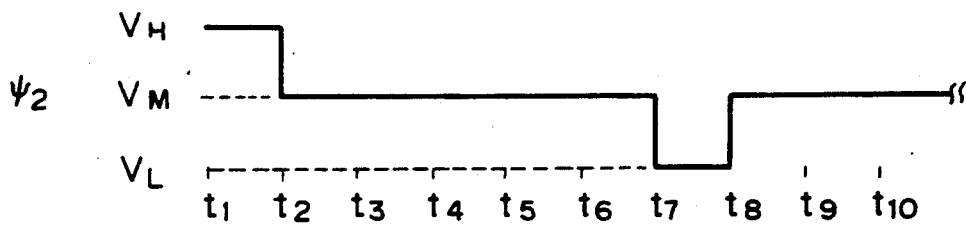
Figure 3C:
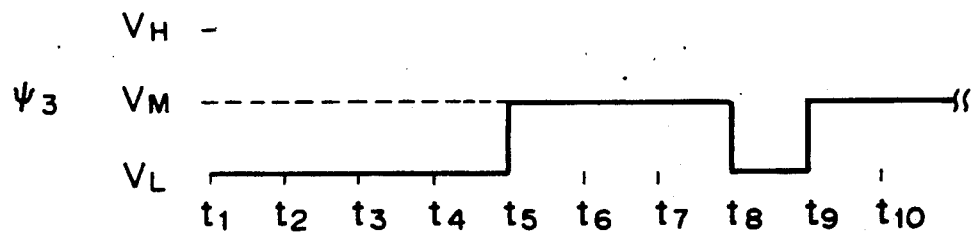
Figure 3D:
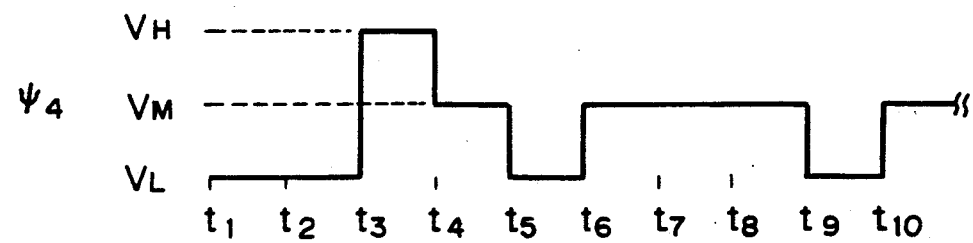
Figure 4A:
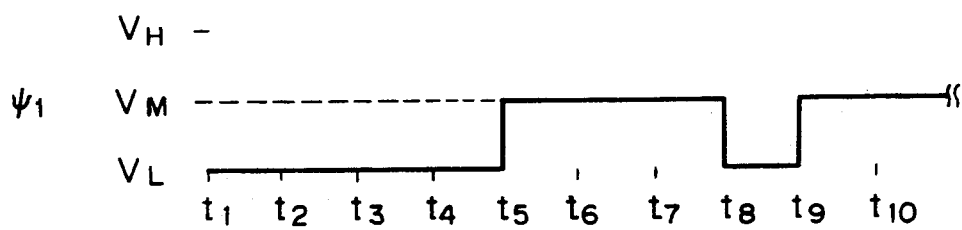
FIG. 4 (A)-(D) is a clock diagram for the second field at NTSC signal operation in the device.
Figure 4B:
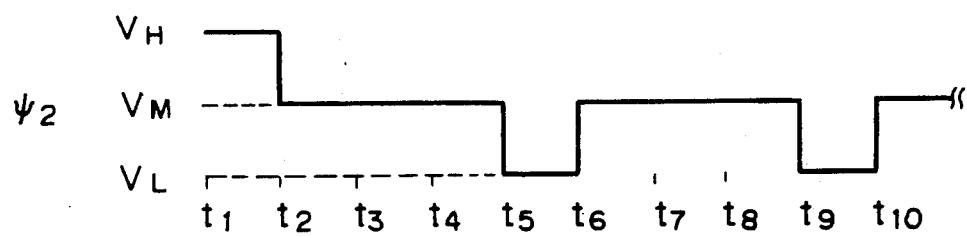
Figure 4C:
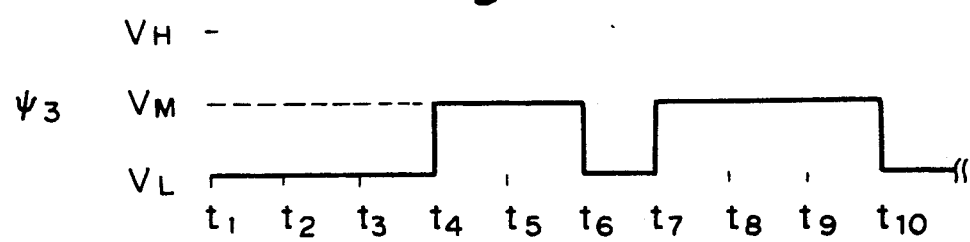
Figure 4D:
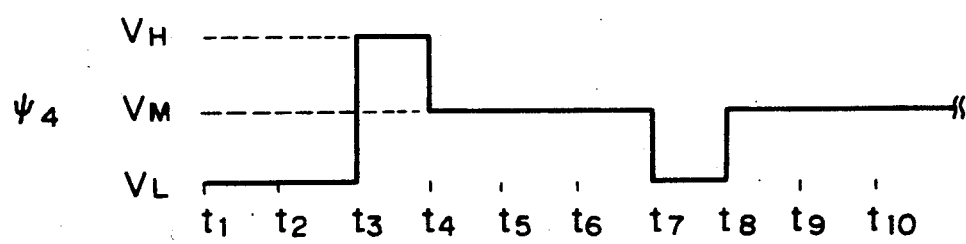

Next, the clock signal $\phi 1$ goes to $V_M$ level between time t4 and time t5, as shown in FIG. 3A.

The electrons from photodiode P31 and the electrons from photodiode P51 are mixed and then transfered sequentially in the first field.

In the second field, the clock signal $\phi 3$ goes to $V_M$ level between time t4 and time t5.

The electrons from photodiode P11 and the electrons from photodiode P31 are mixed and then transfered sequentially.

The device of the first embodiment of the invention has no problem under normal uses, but at a $V_H$ level set at a very high potential value, a pass for transferring the electrons may be formed at an undesired area. This problem is explained as follows refering to FIG. 5 (A) and (B).

At between time t1 and t2, since the clock signal $\Omega 2$ is set at the $V_H$ level, the other clock signal is all $V_L$ level, the electrons are transfered as indicated by the shaded arrow from photodiode p31 and photodiode P21 to the determining vertical channel. And then at between t3 and time t4, the clock signal $\psi 4$ goes to $V_H$ level.

Figure 5A:
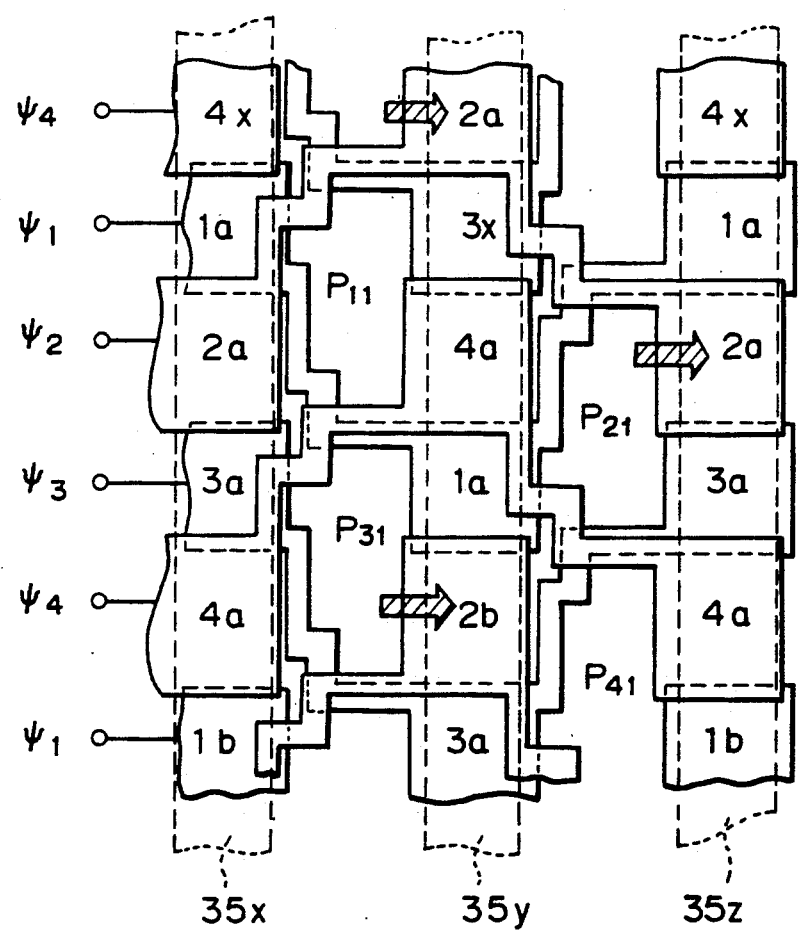
FIG. 5 (A) and (B) are diagrams showing that the electrons are transferred from the photodiode to the vertical channel.
Figure 5B:
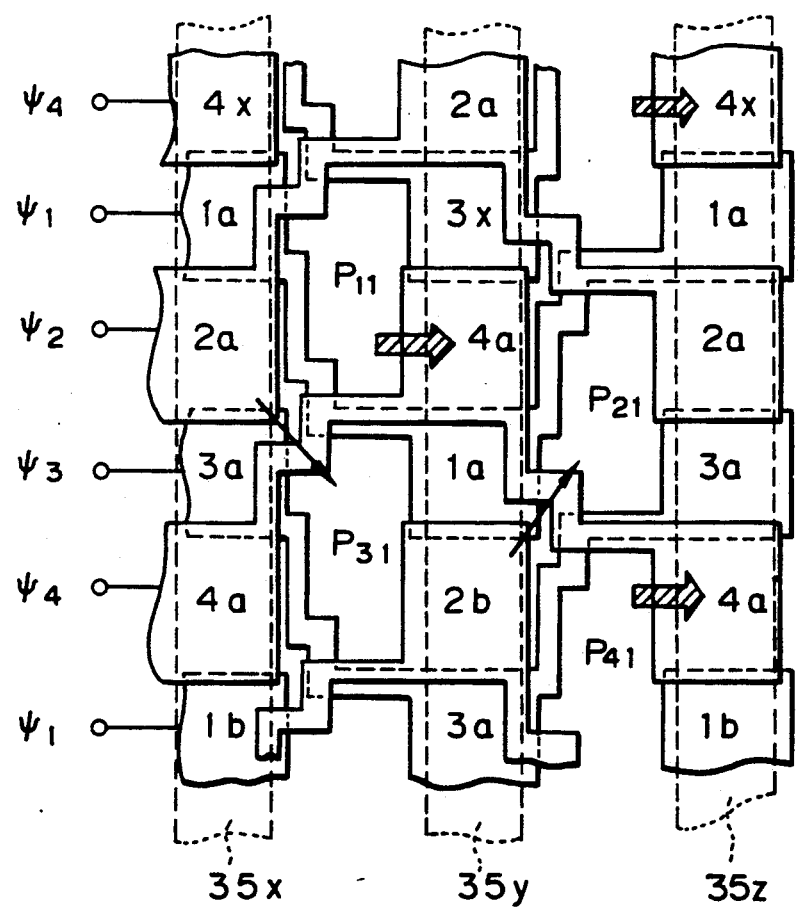

But if the $V_H$ level is set at very high potential value, an undesired pass shown as a black thick arrow in FIG. 5 (B) may be formed. The undesired pass causes disorder of reproducing printed image. The problem is solved by the image sensing device of the second embodiment of the invention.

THE SECOND EMBODIMENT OF THE INVENTION

The device of the second embodiment is a countermeasure to prevent the formation of an undesired pass. Therefore now possible to set the $V_H$ level at a very high potential value. The device of the second embodiment has a broad active margin.

This embodiment also improves the polysilicon pattern form for vertical charge transfer channels.

The device of second embodiment is not different from the device of first embodiment except for the polysilicon pattern. The difference between the second embodiment and the first embodiment is explained mainly as follows.

Figure 6A:
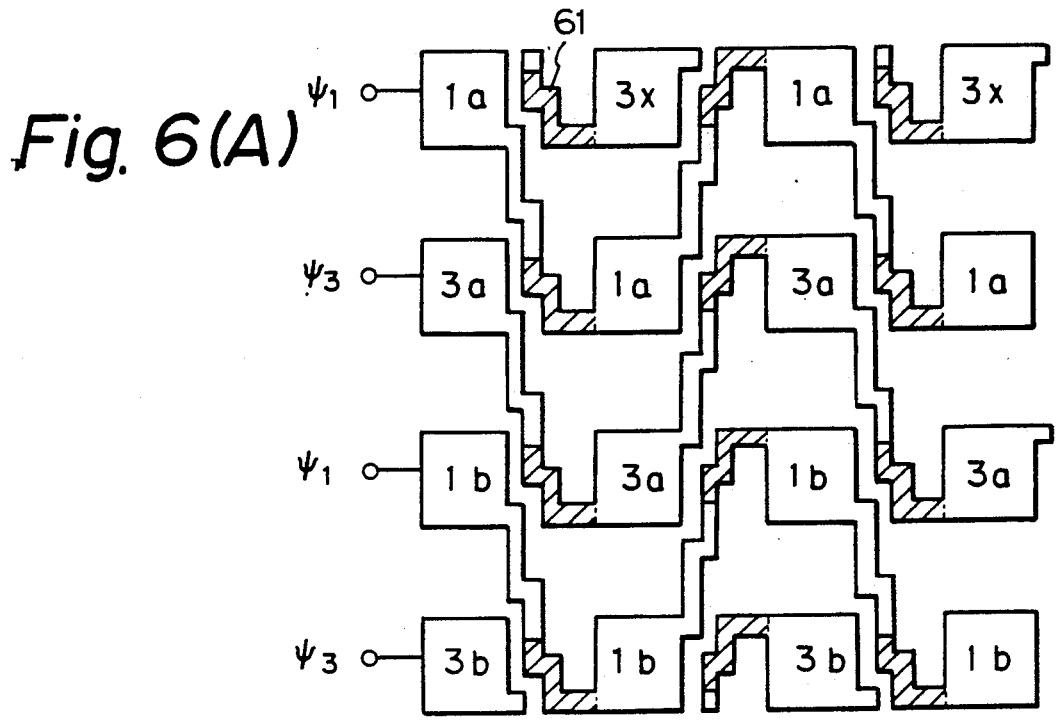
FIG. 6 (A) is the second polysilicon pattern illustrating interconnection relations between the 1st and 3rd electrodes in accordance with the second embodiment of the invention.
Figure 6B:
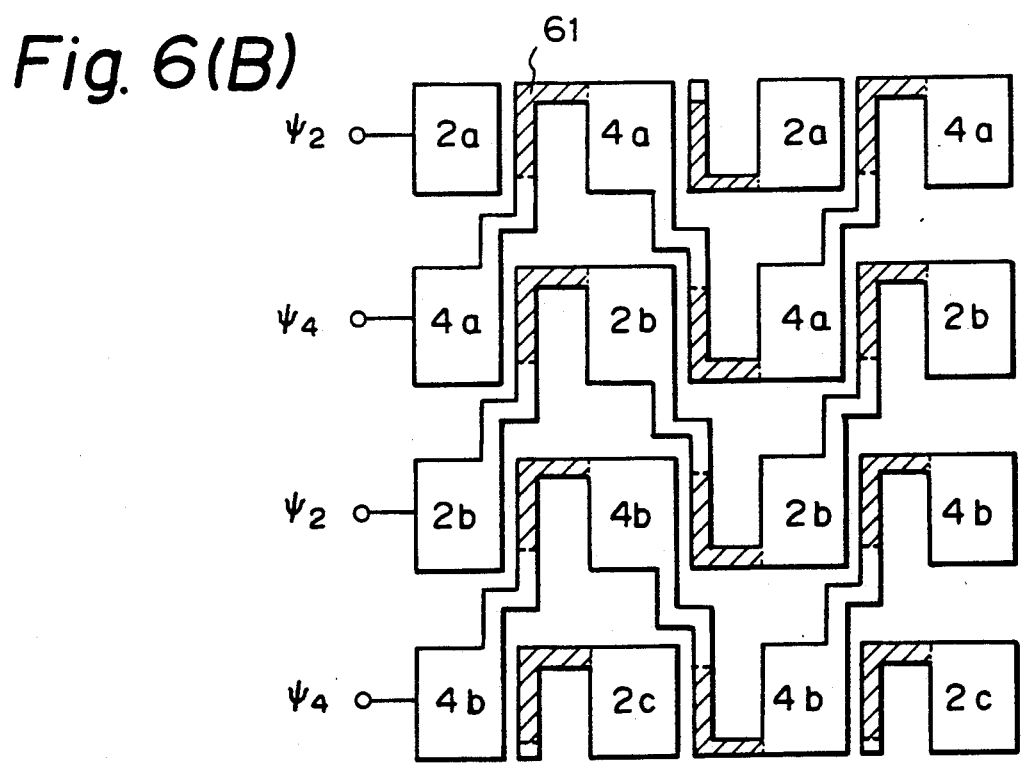
Figure 6C:
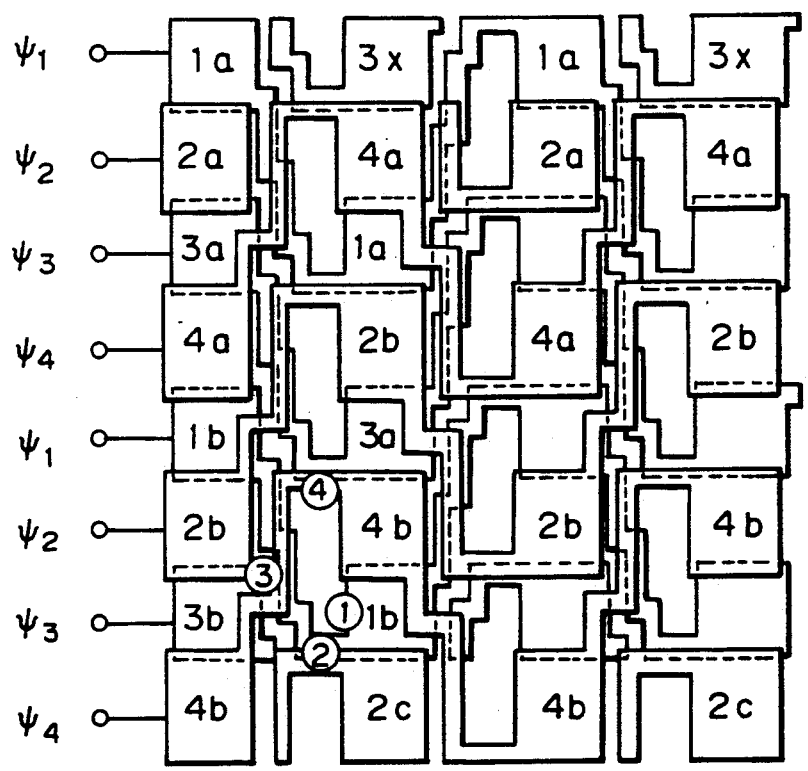

FIG. 6 (A) is the first polysilicon pattern illustrating the interconnection relations between the first and third electrodes in accordance with the second embodiment of the invention. FIG. 6 (B) is the second polysilicon pattern illustrating the interconnection relations between the second and fourth electrodes in accordance with the second embodiment of the invention. FIG. 6

(A) and (B) correspond to FIG. 2 (A) and (B) of the first embodiment.

The polysilicon pattern shown in the second embodiment is disposed to take a larger detour around the photodiode compared to that shown in the first embodiment. By comparing FIG. 2A with FIG. 6A, it will be noted that the polysilicon pattern between the interconnected electrodes is shorter in FIG. 2A than in FIG. 6A. For example, consider the top left electrode 1a in each figure. The polysilicon pattern is connected to the bottom right corner of the top left electrode 1a. In both cases, that polysilicon pattern traverses down and to the right, but in FIG. 2A it connects to the next electrode 1a at its top left corner, whereas in FIG. 6A it connects to the bottom left corner of the adjacent electrode 1a. Likewise, it will be appreciated that in the first embodiment, all polysilicon patterns of FIGS. 2A and 2B take a shorter route in making interconnections than they do in the second embodiment shown in FIGS. 6A and 6B. In the first embodiment, bottom right corners are shown connected to top left corners in the next column to the right. Top right corners are shown connected to bottom left corners in the next column to the right. But in the second embodiment, bottom corners are connected to bottom corners in the adjacent column. The added distance in the second embodiment is shaded area 61 (FIGS. 6A, 6B).

First, a polysilicon pattern shown in FIG. 6 (A) is formed on the P-well 33, and then a polysilicon pattern shown in FIG. 6 (B) is formed to be a predetermined relations.

The vertical transfer channels shown in FIG. 6 (C) are formed by this step.

Of course, in this case, each of photodiodes is surrounded by parts 1, 2, 3 and 4 of the first, second, third and fourth electrodes. Since the operating method and operating principle of the second embodiment is the same as the first embodiment this explanation is omitted.

Figure 7A:
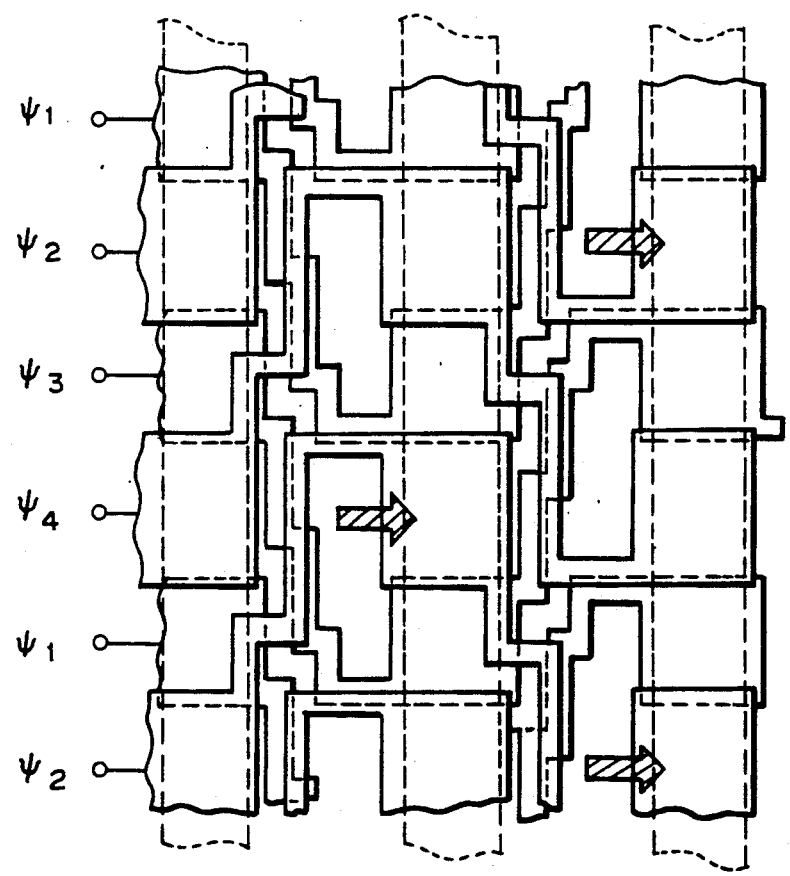
FIG. 7 (A) and (B) are diagrams showing transfer of the electron corresponding to the voltage of the clock signals in accordance with the second embodiment of invention.
Figure 7B:
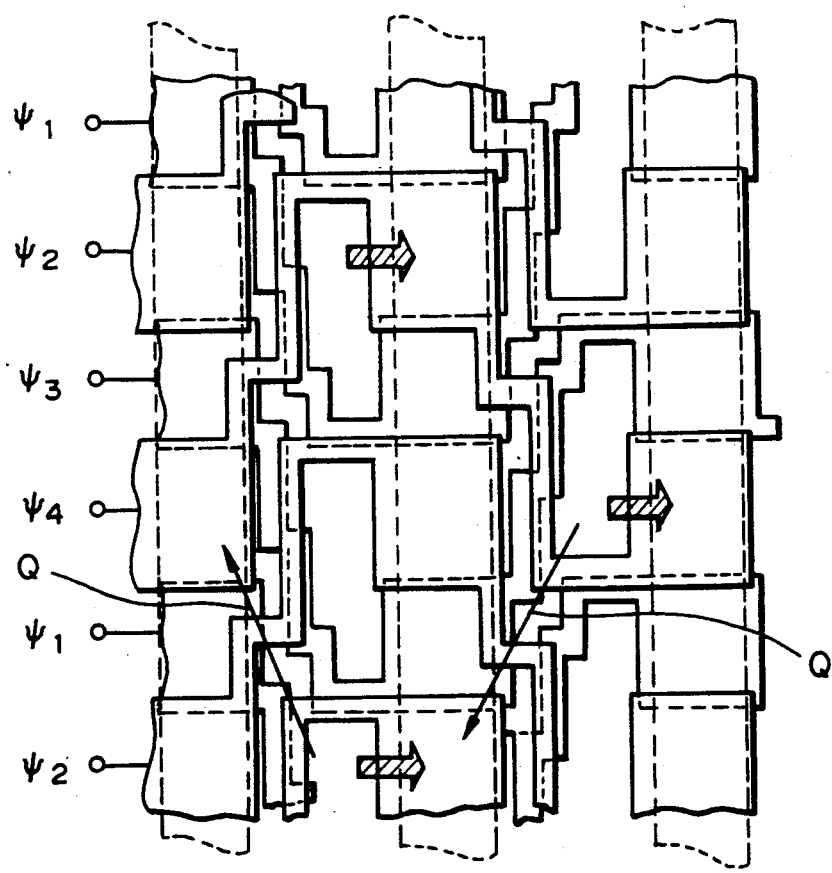
Figure 8A:
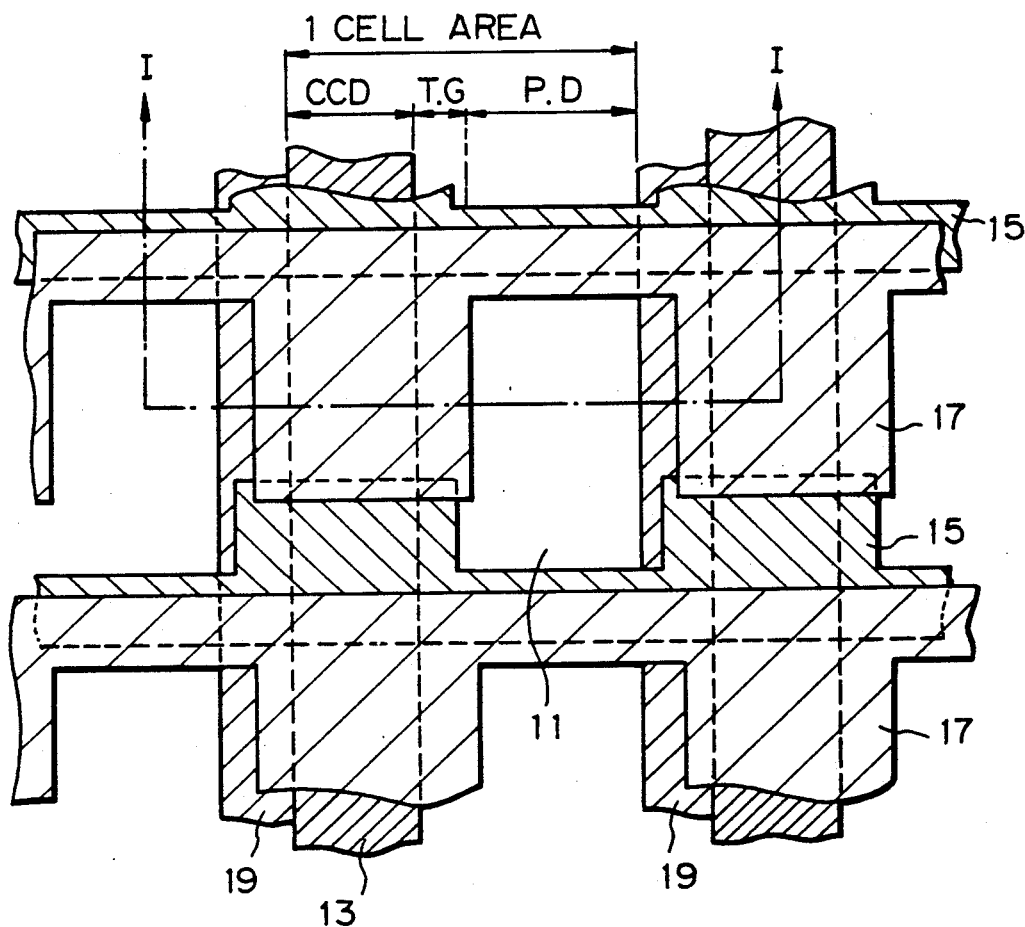
FIG. 8 (A) is a plan view of a conventional solid state image sensing device.
Figure 8B:
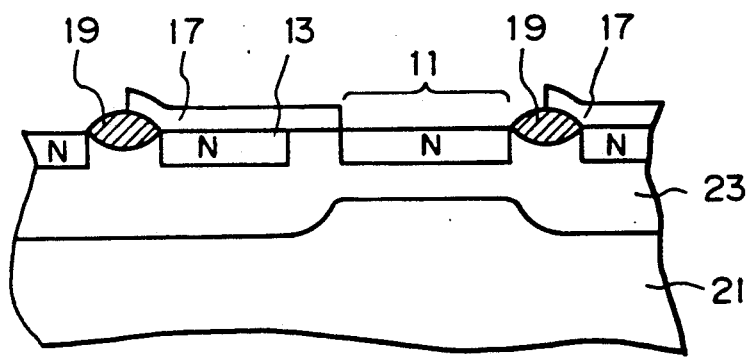

When the clock signal $\phi 2$ goes to $V_H$ level, the electrons in the photodiode are transferred as shown by the shaded arrow to the determined vertical transfer channel. If the clock signal $\phi 4$ goes to $V_H$ level, the pass represented by the arrow Q (FIG. 7B) may be formed.

However, this does not occur because, in the second embodiment, the pass is the same length as one stage of the transfer channel and is twice as long as the pass of the first embodiment. The second electrode which receives clock signal $\phi 2$ is disposed across the pass Q.

Therefore, in accordance with the second embodiment it is possible for the $V_H$ level to be set at high potential value because the electrons are not transferred to the area except to a predetermined vertical channel.

In accordance with the invention, the image sensing device has a wide active area because a field oxide layer or polysilicon for isolation is not formed. It is easy to produce a fine polysilicon layer because a polysilicon pattern is formed more exactly in comparison with a field oxide layer. And it is easy to produce the device with an even surface because the device has no field oxide layer. Therefore since the device has no aggravating factor reliability is improved.

In accordance with the second embodiment of the invention since it is possible that the $V_H$ level is set at high potential level the will operate with higher speed.

What is claimed is:

1. A solid state image sensing device comprising:
   (a) a plurality of vertical electron transfer channels and a plurality of transfer electrodes for receiving different clock signals respectively, said plurality of transfer electrodes comprising first, second, third and fourth electrodes,
   (b) a plurality of polysilicon patterns each corresponding to a respective clock signal and each connecting a respective one of the transfer electrodes in one of the vertical channels to other transfer electrodes receiving the same clock signal in other vertical channels, and
   (c) a plurality of photodiodes being alternately disposed to the vertical channels, each of the photodiodes being surrounded by a part of each of the polysilicon patterns, each said photodiode being isolated from others of said photodiodes without insulating material surrounding each said photodiode individually, and
   (d) each of said first, second, third, and fourth electrodes and associated polysilicon patterns being disposed in a respective zigzag configuration, each of the electrodes including a connecting portion located along the edge of a said photodiode, said zigzag configurations of said first electrodes and said third electrodes being aligned in phase with each other, said zigzag configurations of said second and fourth electrodes being in phase with each other and substantially 180 degrees out of phase with said zigzag configurations of said first and third electrodes.

2. The device according to claim 1, wherein the first and third electrodes are located on a first selected surface, and the second and fourth electrodes are located on a second selected surface.

3. The device according to claim 1 wherein in each vertical electron transfer channel, the electrodes are ordered in a sequence of first, second, third, and then fourth electrodes.

4. The device of claim 1 wherein each said photodiode is isolated from other photodiodes without insulating material surrounding each said photodiode individually.

5. The device of claim 4 wherein the connecting portions of the electrodes provide isolation for the photodiodes.

6. The device of claim 1 wherein a first set of the electrodes are coupled to receive lower voltages and a second set of the electrodes are coupled to receive a higher voltage.

7. A solid state image sensing device comprising:
   a plurality of electron transfer channels;
   a plurality of photodiodes, each disposed adjacent to an electron transfer channel; and
   a plurality of electrode patterns disposed on the electron transfer channels and the photodiodes, the patterns having a transfer gate pattern for transferring electrons from the photodiodes when a high voltage is applied thereto, and a low voltage is applied to the other patterns;
   each said photodiode being isolated from others of said photodiodes without insulating material surrounding each said photodiode individually.

8. The device of claim 7 wherein said isolation occurs by surrounding each said photodiode with said electrode patterns.

9. A solid state image sensing device comprising:
   an electron transfer channel formed at a surface of a body, a first electrode and a second electrode overlying the electron transfer channel, said first and second electrodes being coupled to receive first and second level voltages, respectively;

a photodiode array having a plurality formed at the surface of the body; and a first electrode extension extending from the first electrode so as to cover an edge portion of one of the photodiodes; and a second electrode extension extending from the second electrode and overlying but isolated from the first electrode extension;

the second electrode transferring electrons from the photodiode to the electron transfer channel in response to said second level voltage being applied to the second electrode, and the first level voltage being applied to the first electrode, said second level voltage being higher than said first level voltage.

10. A solid state image sensing device according to claim 9 further comprising an electron transfer area at the surface of the body, the electron transfer area being disposed between the photodiode and the electron transfer channel, wherein the second electrode overlays both the electron transfer channel and the electron transfer area, and enables electrons to transfer from the photodiode to the electron transfer channel through the electron transfer area.

11. A solid state image sensing device according to claim 10 wherein the first level voltage is applied to only the first electrode to prevent electrons from transferring through the body except at the electron transfer area.

* * * * *